(12) United States Patent
Foong et al.

(10) Patent No.: US 9,698,093 B2
(45) Date of Patent: Jul. 4, 2017

(54) UNIVERSAL BGA SUBSTRATE (71) Applicant: FREESCALE SEMICONDUCTOR, INC., Austin, TX (US)

(72) Inventors: Chee Seng Foong, Austin, TX (US); Ly Hoon Khoo, Petaling Jaya (MY); Wen Shi Koh, Petaling Jaya (MY); Wai Yew Lo, Petaling Jaya (MY); Zi Song Poh, Petaling Jaya (MY); Kai Yun Yow, Petaling Jaya (MY)

(73) Assignee: NXP USA,INC., Austin, TX (US)

( * ) Notice: Subject to any disclaimer, the term of this patent is extended or adjusted under 35 U.S.C. 154(b) by 0 days.

(21) Appl. No.: 14/833,148

(22) Filed: Aug. 24, 2015

(65) Prior Publication Data
US 2017/0062320 A1   Mar. 2, 2017

(51) Int. Cl.
*H01L 23/48* (2006.01)
*H01L 23/52* (2006.01)
(Continued)

(52) U.S. Cl.
CPC .... *H01L 23/49838* (2013.01); *H01L 21/4853* (2013.01); *H01L 21/561* (2013.01); *H01L 21/565* (2013.01); *H01L 21/78* (2013.01); *H01L 23/3128* (2013.01); *H01L 23/49827* (2013.01); *H01L 24/49* (2013.01); *H01L 24/85* (2013.01); *H01L 24/97* (2013.01); *G03F 9/7073* (2013.01); *G03F 9/7084* (2013.01); *H01L 21/486* (2013.01); *H01L 21/76816* (2013.01); *H01L 23/481* (2013.01); *H01L 23/49816* (2013.01);
(Continued)

(58) Field of Classification Search
CPC ..... H01L 23/49816; H01L 2924/15311; H01L 2924/15321; H01L 2924/15331; H01L 23/544; H01L 2223/544; H01L 2223/5446; H01L 2223/54453; H01L 21/4853; H01L 21/561; H01L 21/565; H01L 21/78; H01L 21/486; H01L 21/76816; H01L 2224/48235; H01L 2224/13009; H01L 2224/13025; H01L 23/481; H01L 23/49827; H01L 23/5384; H01L 23/3128; H01L 23/49838; H01L 24/49; H01L 24/85; H01L 24/97; H01L 2225/06544; H01L 2225/06548; G03F 9/7073; G03F 9/7084; B60K 37/06; G06F 2203/04104; G06F 3/016; G06F 3/041; G06F 3/0416
USPC .................. 257/797, E23.001, E23.179, 738
See application file for complete search history.

(56) References Cited

U.S. PATENT DOCUMENTS

5,805,421 A    9/1998 Livengood et al.
6,040,530 A *  3/2000 Wharton ............... G01R 31/316
                                              174/261
(Continued)

*Primary Examiner* — Teresa M Arroyo
(74) *Attorney, Agent, or Firm* — Charles E. Bergere (57) ABSTRACT

A universal substrate for assembling ball grid array (BGA) type integrated circuit packages has a non-conducting matrix, an array of conducting vias extending between top and bottom surfaces of the matrix, and one or more instances of each of two or more different types of fiducial pairs on the top surface of the matrix. Each instance of each different fiducial pair indicates a location of a different via sub-array of the substrate for a different BGA package of a particular package size. The same substrate can be used to assemble BGA packages of different size, thereby avoiding having to design a different substrate for each different BGA package size.

9 Claims, 9 Drawing Sheets

(51) Int. Cl.
  *H01L 29/40* (2006.01)
  *H01L 23/498* (2006.01)
  *H01L 23/31* (2006.01)
  *H01L 23/00* (2006.01)
  *H01L 21/56* (2006.01)
  *H01L 21/78* (2006.01)
  *H01L 21/48* (2006.01)
  *H01L 23/544* (2006.01)
  *G03F 9/00* (2006.01)
  *H01L 23/538* (2006.01)
  *H01L 21/768* (2006.01)

(52) U.S. Cl.
  CPC ........ *H01L 23/5384* (2013.01); *H01L 23/544* (2013.01); *H01L 2223/544* (2013.01); *H01L 2223/5446* (2013.01); *H01L 2224/13009* (2013.01); *H01L 2224/13025* (2013.01); *H01L 2224/48235* (2013.01); *H01L 2225/06544* (2013.01); *H01L 2225/06548* (2013.01); *H01L 2924/15311* (2013.01); *H01L 2924/15321* (2013.01)

(56) References Cited

U.S. PATENT DOCUMENTS

| | | |
|---|---|---|
| 6,111,756 A | 8/2000 | Moresco et al. |
| 6,638,831 B1 | 10/2003 | Roberts et al. |
| 6,841,486 B2 | 1/2005 | Boudreau et al. |
| 6,941,646 B2 | 9/2005 | Suhara |
| 7,030,772 B1 | 4/2006 | Lee et al. |
| 8,234,780 B2 | 8/2012 | Harvilchuck et al. |
| 8,877,523 B2* | 11/2014 | Leal ............... H01L 23/3135 438/110 |
| 2002/0020902 A1* | 2/2002 | Prindiville ........... H01L 21/565 257/678 |
| 2004/0031779 A1* | 2/2004 | Cahill ................ B23K 26/04 219/121.83 |
| 2007/0216041 A1* | 9/2007 | Patti ................ H01L 21/76898 257/797 |
| 2009/0001573 A1* | 1/2009 | Jirawongsapiwat .... H01L 22/14 257/738 |
| 2011/0247511 A1 | 10/2011 | Carlson et al. |
| 2012/0049376 A1* | 3/2012 | Harada ............... H01L 24/32 257/773 |
| 2012/0119335 A1* | 5/2012 | Shen ................. H01L 23/481 257/621 |
| 2012/0146177 A1* | 6/2012 | Choi ................ H01L 25/16 257/528 |
| 2012/0225538 A1* | 9/2012 | Kim ................ G03F 9/7084 438/462 |
| 2013/0052777 A1* | 2/2013 | Xu ................... H01L 21/568 438/127 |
| 2013/0280826 A1* | 10/2013 | Scanlan ............. H01L 23/544 438/15 |
| 2014/0175613 A1* | 6/2014 | Foong ................ H01L 21/77 257/620 |
| 2015/0001730 A1* | 1/2015 | Raorane ............... H01L 24/18 257/773 |
| 2015/0108615 A1* | 4/2015 | Dayringer ........... H01L 25/50 257/623 |
| 2016/0093533 A1* | 3/2016 | Yow .................. H01L 21/78 257/773 |

* cited by examiner

FIG. 9

US 9,698,093 B2

UNIVERSAL BGA SUBSTRATE

BACKGROUND

The present invention relates to integrated circuit (IC) packaging and, more particularly, to a substrate for ball grid array (BGA) packaging.

It is known to design an IC package having a ball grid array, i.e., a two-dimensional array of solder balls, attached to the bottom surface of the package that enables it to be mounted onto and electrically connected to another component such as a printed circuit board (PCB). It is also known to design BGA packages having different layout sizes. Conventional wire-bonded BGA package layout sizes range from 6 mm×6 mm up to 31 mm×31 mm. 6 mm×6 mm BGA packages are referred to herein as 6 mm BGA packages, and other size BGA package sizes are similarly named. Typically, different BGA packages are designed with BGAs that are specific to the particular size of the BGA package, where those BGAs are not adapted for use with BGA packages of a different size. Depending on the number and pitch of the I/O pads for a package, different BGA ball sizes (diameters) can be used for different package sizes. For example, a 23-mil diameter sphere can be used on 6 mm or 11 mm packages.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, a substrate for ball grid array (BGA) packages comprises (i) a non-conducting matrix having a top surface and a bottom surface; (ii) an array of conducting vias extending between the top and bottom surfaces of the matrix; (iii) one or more instances of a first fiducial pair on the top surface of the matrix, wherein each instance of the first fiducial pair indicates a location of a different via sub-array of the substrate for a different BGA package of a first package size; and (iv) one or more instances of a second fiducial pair, different from the first fiducial pair, on the top surface of the matrix, wherein each instance of the second fiducial pair indicates a location of a different via sub-array of the substrate for a different BGA package of a second package size different from the first package size.

Another embodiment is a method for assembling one or more BGA packages having a specified package size, the method comprises (a) providing the substrate of the previous embodiment; (b) locating one or more instances of a fiducial pair on the top surface of the matrix, the fiducial pair corresponding to the specified package size, each located instance of the fiducial pair corresponding to a different via sub-array for a different BGA package of the specified package size; (c) for each via sub-array, mounting an IC die on the top surface of the matrix within the via sub-array; (d) for each via sub-array, wire bonding the IC die to vias on the top surface of the matrix located within the via sub-array; (e) applying molding compound onto the top surface of the matrix to encapsulate each IC die and its bond wires into an assembly; and (f) singulating the one or more BGA packages from the assembly of step (e).

Yet another embodiment is a BGA package assembled using the method of the previous embodiment.

Figure 1:
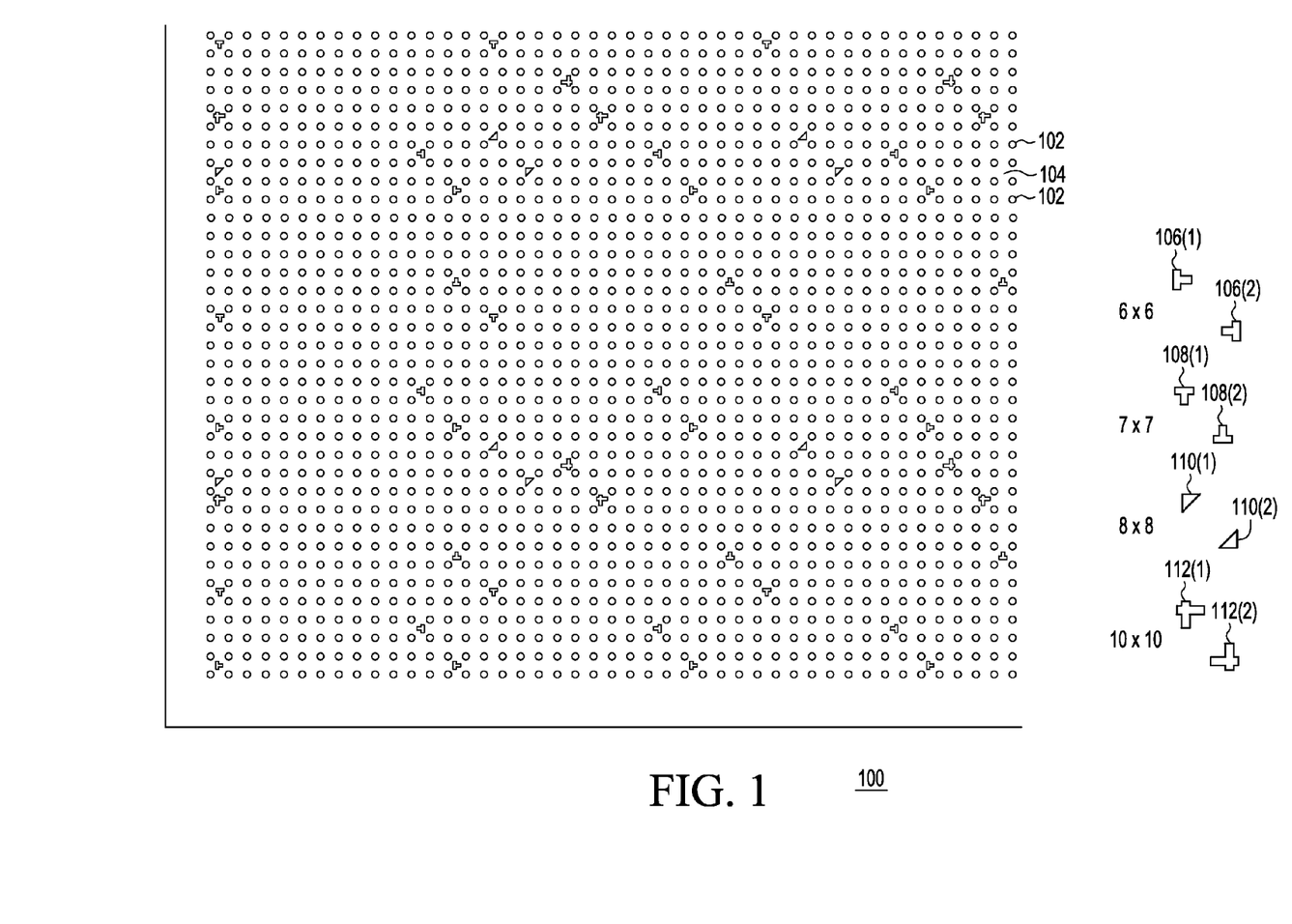
FIG. 1 is top plan view of a portion of a universal BGA substrate of the invention that can be used to assemble BGA packages having different sizes.

FIG. 1 is top plan view of a portion of a universal BGA substrate 100 of the invention that can be for used to assemble BGA packages having a variety of different sizes. In particular, universal BGA substrate 100 is designed to be used to assemble BGA packages of any of sizes 6 mm, 7 mm, 8 mm, and 10 mm. The universal BGA substrate 100 may extend further and in a like manner in any one or more of the four lateral directions in FIG. 1.

The universal BGA substrate 100 comprises a two-dimensional array of conducting vias 102 in a non-conducting matrix 104. In one embodiment, the conducting vias 102 are made of copper, and the non-conducting matrix 104 is made of bismaleimide triazine (BT) substrate, polyimide tape, or any suitable dielectric material, including glass or ceramics. Those skilled in the art will understand that the conducting vias 102 may be made of other suitable conducting metals or non-metals and/or that the non-conducting matrix 104 may be made of other suitable non-conducting materials. The conducting vias 102 extend from the top surface of the universal BGA substrate 100 shown in FIG. 1 to its bottom surface (not shown in FIG. 1).

As shown in FIG. 1, the top surface of the universal BGA substrate 100 also has multiple instances of four different pairs of fiducials 106-112. For example, FIG. 1 shows six instances of a first pair of corresponding fiducials 106(1) and 106(2). The bottom and right side of FIG. 1 also shows six other instances of fiducial 106(1), but those fiducials 106(1) correspond to fiducial pairs in which the corresponding fiducial 106(2) is not present in the portion of the substrate 100 shown in FIG. 1.

Each fiducial 106(1) defines the location of the upper left (in the view of FIG. 1) corner of a via sub-array suitable for use in assembling a 6 mm BGA package. Similarly, each corresponding fiducial 106(2) of the same fiducial pair defines the location of the lower right corner of that same via sub-array. Note that fiducials 106(2) have the same shape as, but a different, uniquely identifiable orientation from the fiducials 106(1). These shapes are used merely as examples in this description. Other suitable shapes may also be used. In addition, the pair of fiducials need not be of the same mirrored image shapes as long as each pair is unique for the package size they represent.

Figure 2:
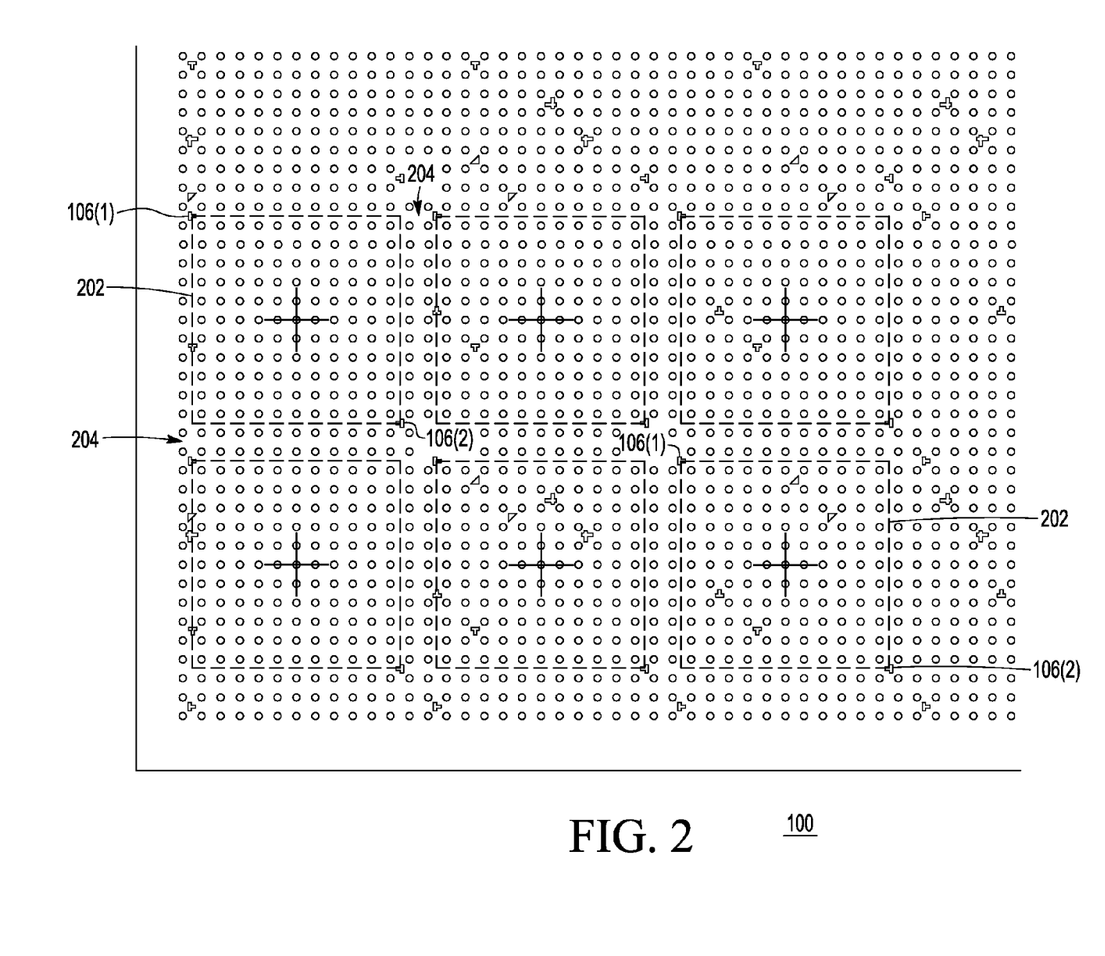
FIG. 2 is a top plan view of the substrate portion of FIG. 1 showing, in dashed lines, the outer boundaries of six different via sub-arrays in the substrate available for use in assembling six different 6 mm BGA packages.

FIG. 2 shows, in dashed lines, the outer boundaries of six different via sub-arrays 202 in substrate 100 available for use in assembling six different 6 mm BGA packages. The centers of those via sub-arrays 202 are indicated in FIG. 2 with plus ("+") signs. Note that the dashed lines and the plus signs imaginary elements that are not actually part of the substrate 100, but are shown in FIG. 2 to indicate the locations of the six different sub-arrays that are defined by the six identical instances of fiducial pair 106(1) and 106(2) laid out in equal pitch in the X and Y directions, that are actually part of the substrate 100 as shown in FIGS. 1 and 2. Note further that between adjacent via sub-arrays 202 are "keep-out zones" 204 that are described further below. Each package sub-array 202 is marked by one pair of fiducials 106(1) and 106(2), and adjacent package sub-arrays 202 are separate by a keep-out zone Ggap 204.

Referring again to FIG. 1, in an analogous manner to the fiducial pairs 106(1) and 106(2), the top surface of the substrate 100 also has six instances of corresponding fiducial pair 108(1) and 108(2) that respectively define the upper left and lower right corners of six via sub-arrays suitable for use in assembling 7 mm BGA packages. Note that the fiducials 108(1) and 108(2) for 7 mm BGA packages have the same shapes as, but different, uniquely identifiable orientations from the fiducials 106(1) and 106(2) for 6 mm BGA packages.

Figure 3:
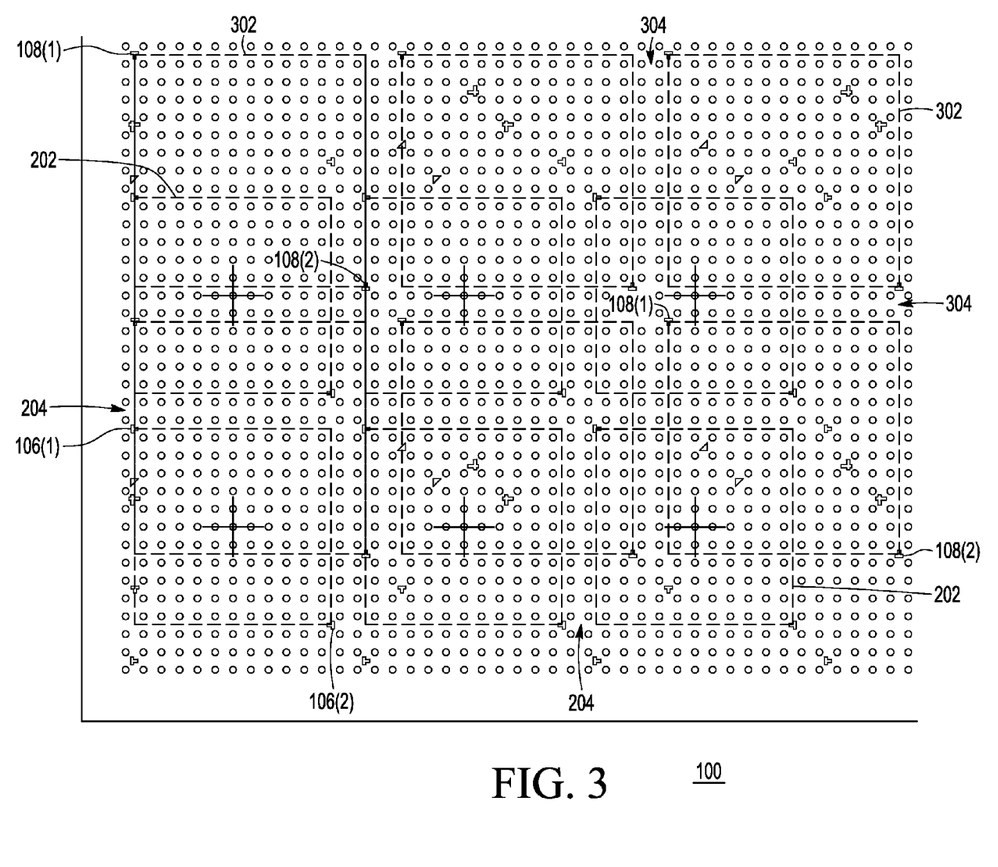
FIG. 3 is a top plan view of the substrate portion of FIG. 1 showing, in dashed lines, the outer boundaries of the six via sub-arrays in the substrate for 7 mm BGA packages superimposed with the dashed lines for the six via sub-arrays of FIG. 2 for 6 mm BGA packages.

FIG. 3 shows, in imaginary dashed lines, the outer boundaries of those six via sub-arrays 302 in the substrate 100 for 7 mm BGA packages superimposed with the imaginary dashed lines for the six via sub-arrays 202 of FIG. 2 for 6 mm BGA packages. Here, too, there are keep-out zones 304 between adjacent via sub-arrays 302 of the same size.

Referring again to FIG. 1, in addition to the 6 mm fiducial pairs 106(1) and 106(2) and the 7 mm fiducial pairs, the top surface of the substrate 100 also has (i) two instances of corresponding fiducial pair 110(1) and 110(2) that respectively define the upper left and lower right corners of two via sub-arrays suitable for use in assembling 8 mm BGA packages and (ii) two instances of corresponding fiducial pair 112(1) and 112(2) that respectively define the upper left and lower right corners of two via sub-arrays suitable for use in assembling 10 mm BGA packages. Note that the fiducials 110(1) and 110(2) for 8 mm BGA packages have different, uniquely identifiable shapes from the fiducials 106(1), 106(2), 108(1), and 108(2). Similarly, the fiducials 112(1) and 112(2) for 10 mm BGA packages have different, uniquely identifiable shapes from all of the other fiducials.

Figure 4:
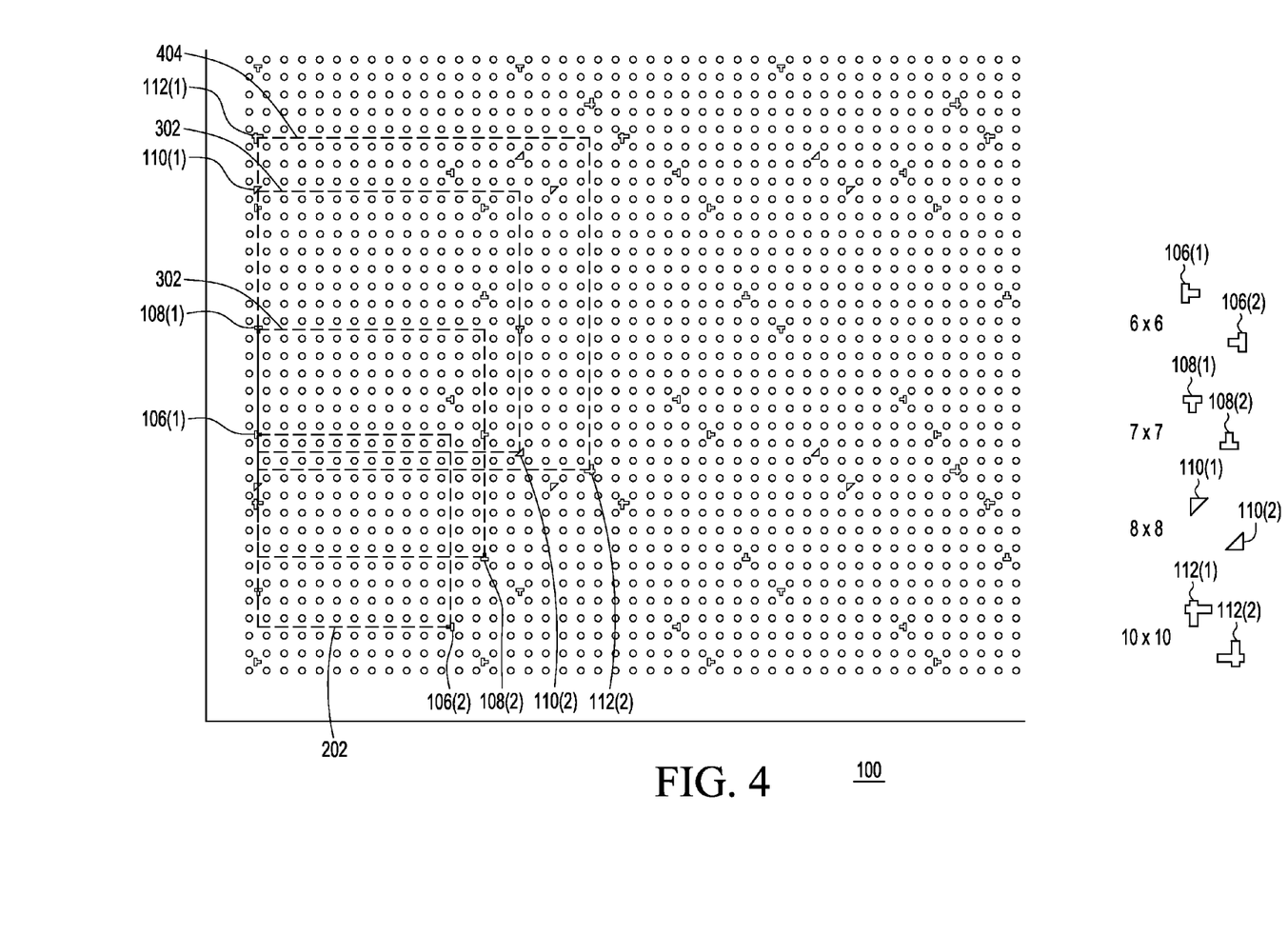
FIG. 4 is a top plan view of the substrate portion of FIG. 1 showing, in dashed lines, the outer boundaries of four differently sized via sub-arrays for four differently sized BGA packages.

FIG. 4 shows, in imaginary dashed lines, the outer boundaries of four differently sized via sub-arrays for four differently sized BGA packages: via sub-array 202 for a 6 mm BGA package, via sub-array 302 for a 7 mm BGA package, via sub-array 402 for an 8 mm BGA package, and via sub-array 404 for a 10 mm BGA package. FIG. 4 also shows imaginary, magnified views of the four different types of fiducial pairs corresponding to those four different via sub-arrays.

Those skilled in the art will understand that, in the prior art, fiducials are often used to uniquely identify the location and orientation of components during the assembly of BGA packages. Similar imaging techniques can be used to identify the location and orientation of different sub-arrays of the substrate 100. Thus, when substrate 100 is used to assemble 6 mm BGA packages, those imaging techniques are used to locate the instances of fiducial pair 106(1) and 106(2), which in turn define the locations and orientations of the corresponding via sub-arrays 202 of FIG. 2. And analogously for BGA packages of the other sizes.

Those skilled in the art will also understand that there are different ways of applying fiducials onto the top surface of a substrate. For example, fiducials can be metal features that are applied to or formed on the substrate using standard IC photolithography techniques. To achieve unique shapes, photolithography with masking may be employed. Newer methods like Direct Laser Write may also be employed, but, in general, any substrate fabrication processes can be used.

Figure 5:
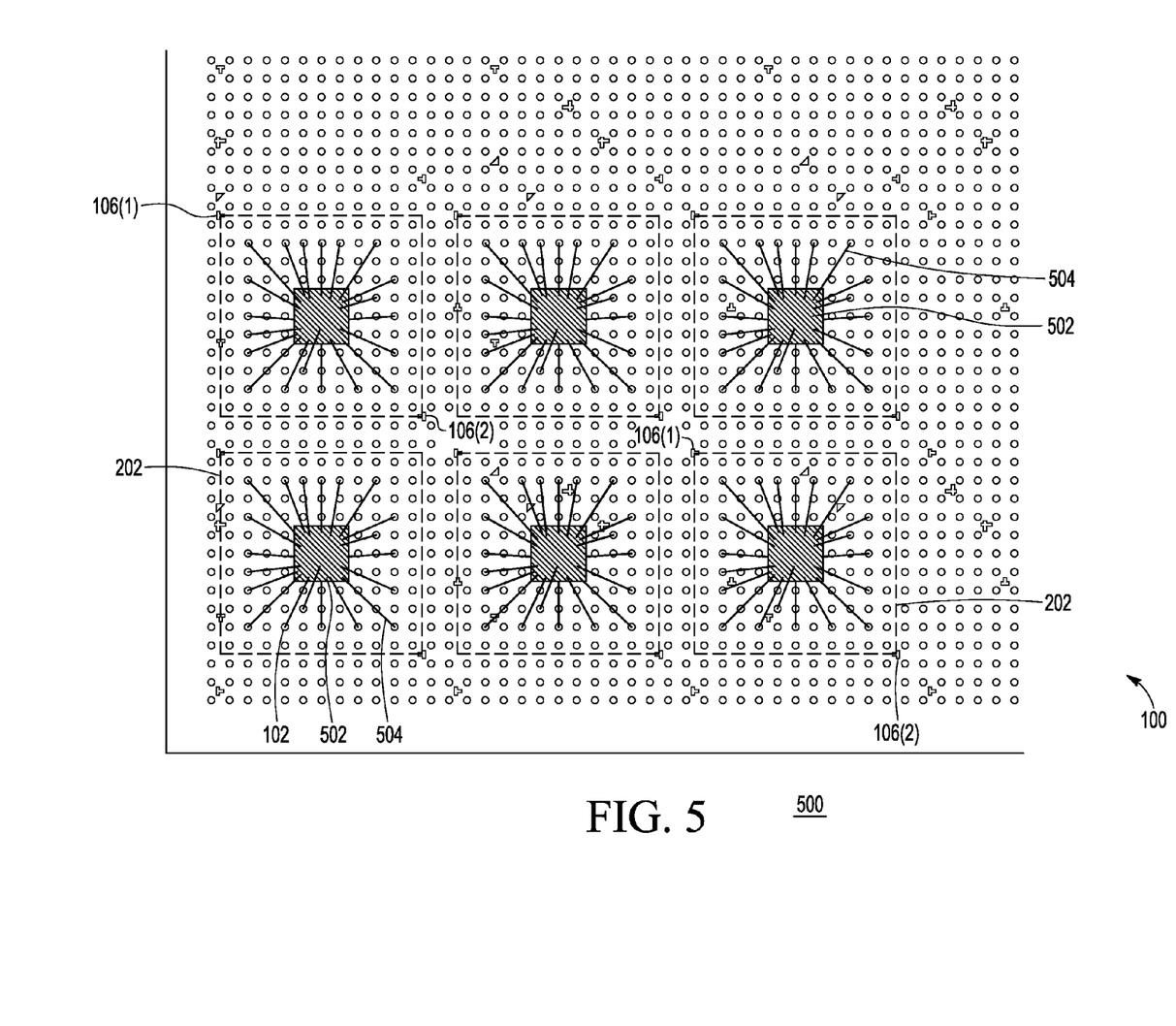
FIGS. 5 and 6 are top plan views corresponding to two different stages in the assembly of six different 6 mm BGA packages using the substrate of FIG. 1.

FIG. 5 is a top plan view of a portion of a sub-assembly 500 corresponding to six different 6 mm BGA packages being assembled using the universal BGA substrate 100 of FIG. 1. FIG. 5 shows six different IC dies 502, each mounted at the center of a different via sub-array 202 (indicated using imaginary dashed lines). FIG. 5 also shows bond wires 504 connecting bond pads (not explicitly shown) on the top surfaces of the IC dies 502 to different vias 102 located within the corresponding via sub-arrays 202. The IC dies 502 can be mounted onto the substrate 100 using pick-and-place machinery that relies on the fiducial pairs 106(1) and 106(2) to identify the centers of the different via sub-arrays 202. The same may be true for the wire-bonding machinery that attaches the bond wires 504.

Figure 6:
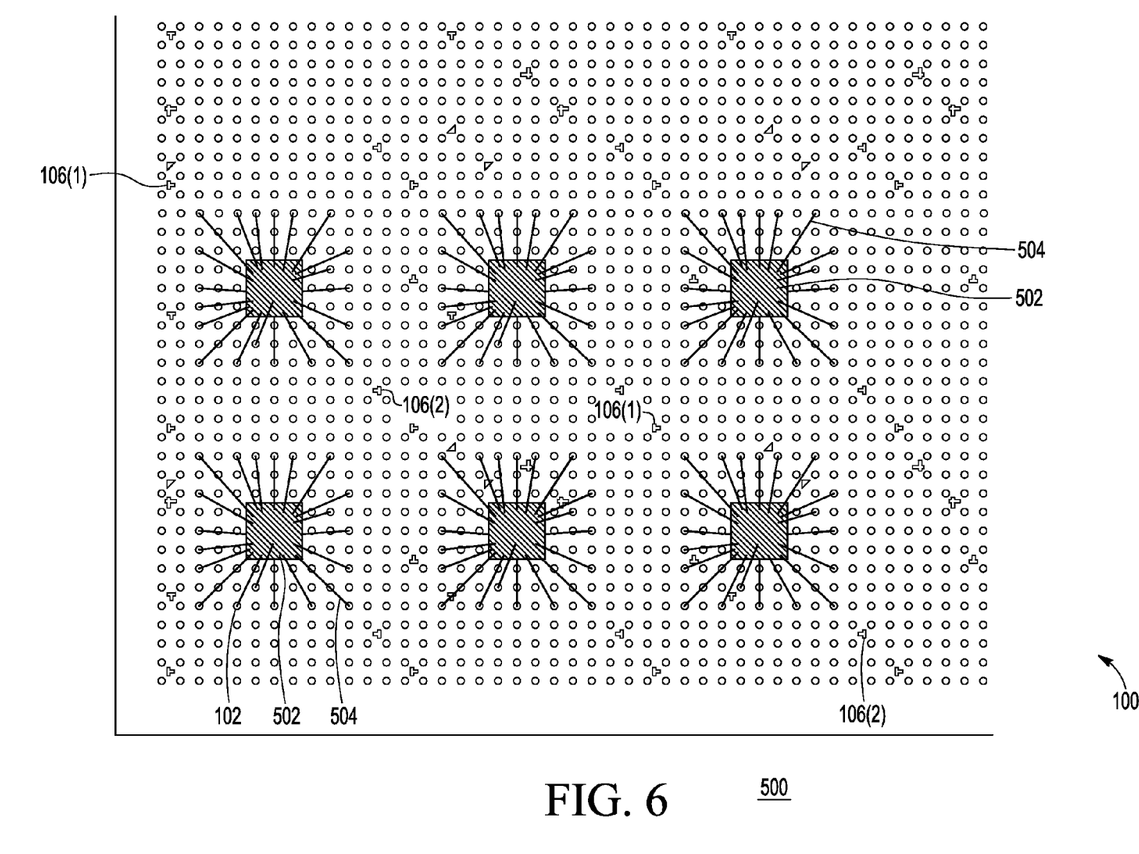

FIG. 6 is a top plan view of the portion of the sub-assembly 500 of FIG. 5 without the imaginary boundaries of the six different via sub-arrays 202. As such, FIG. 6 is a more-realistic view of the sub-assembly 500.

Figure 7:
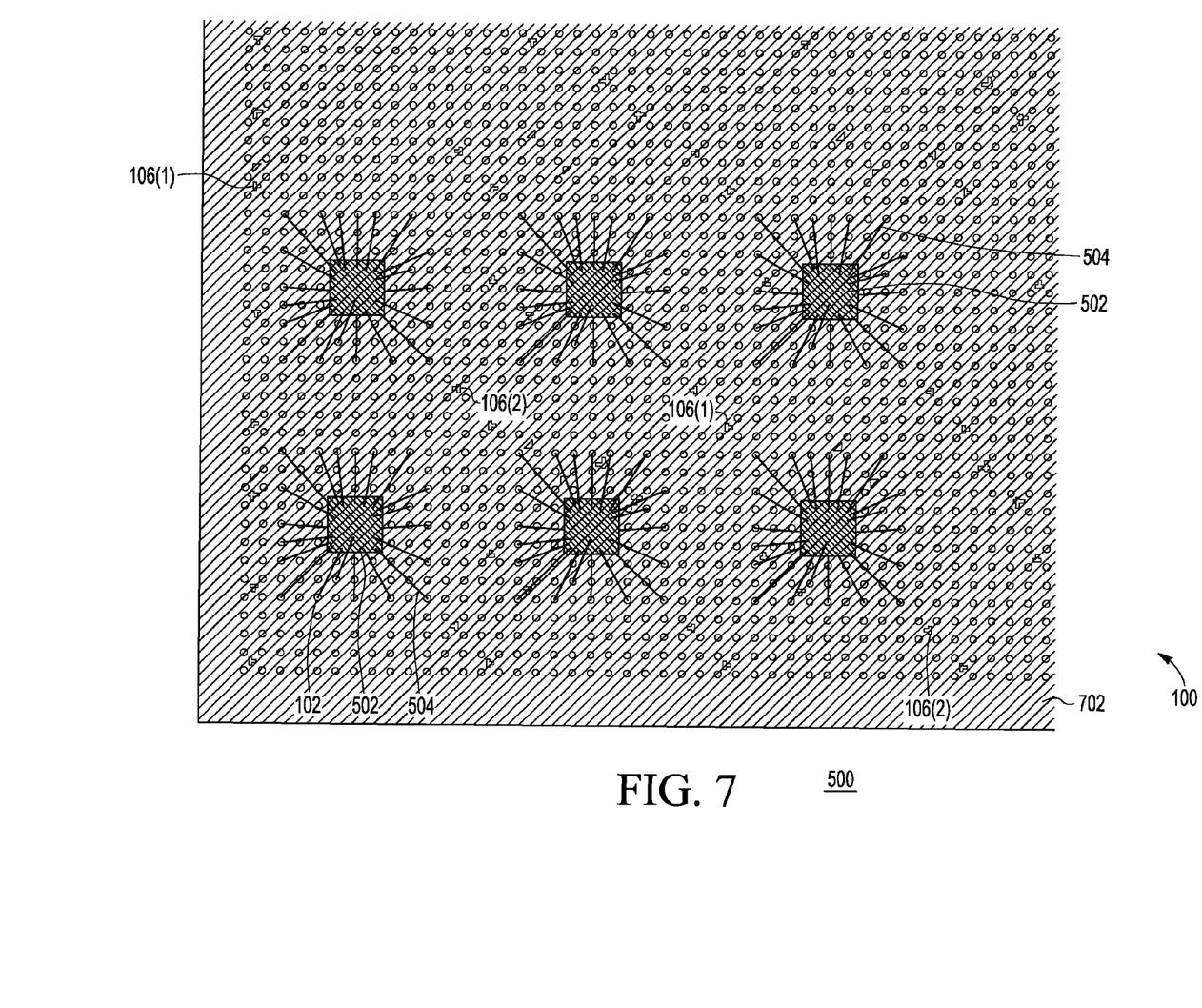
FIG. 7 is a top cross-sectional view corresponding to two different stages in the assembly of six different 6 mm BGA packages using the substrate of FIG. 1

FIG. 7 is a top X-ray view of the portion of the sub-assembly 500 of FIG. 5 after being overmolded with a molding compound 702 that encapsulates the IC dies 502 and the bond wires 504. Note that FIG. 7 is an X-ray view because, unless the molding compound 702 is transparent or at least translucent, the vias 102, the fiducials 106-112, the IC dies 502, and the bond wires 504 would not be visible in a top plan view.

Figure 8:
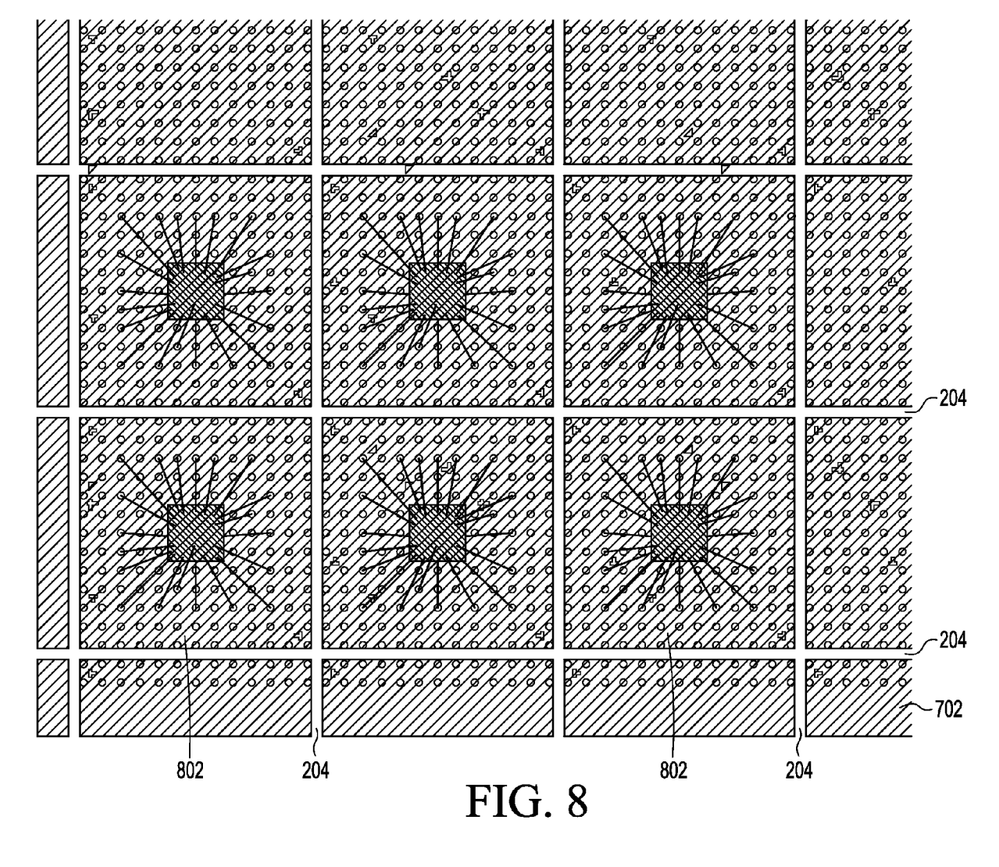
FIG. 8 is a top cross-sectional view of the six different 6 mm BGA packages after the sub-assembly of FIG. 7 has been singulated by sawing through the 6 mm keep-out zones of the substrate of FIG. 1.

FIG. 8 is a top X-ray view of the portion of the assembly of FIG. 7 after the individual BGA packages 802 have been singulated by sawing through the keep-out zones 204 of the substrate 100. The keep-out zones 204 provide space for the singulation to be performed without damaging the resulting BGA packages 802.

Figure 9:
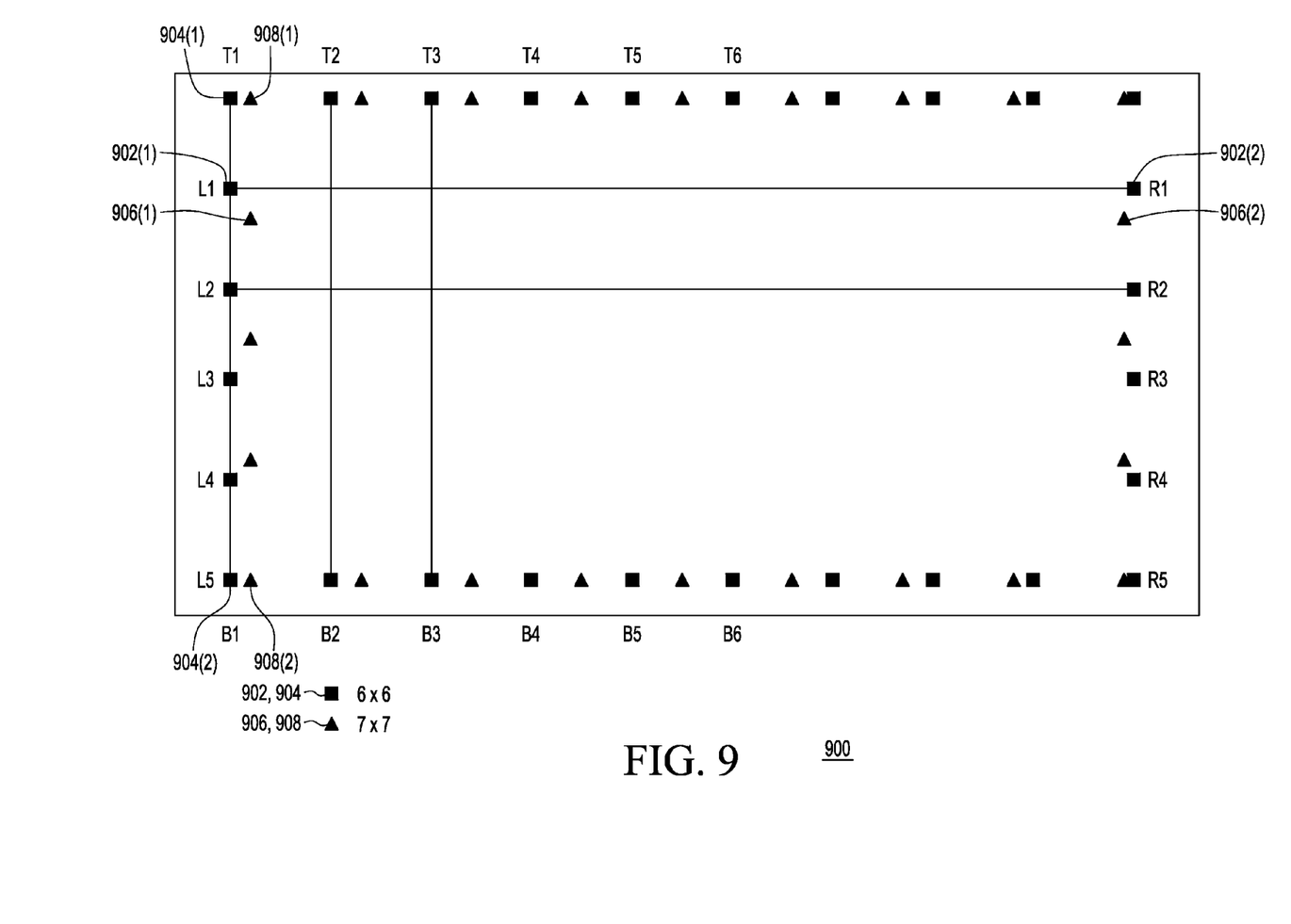
FIG. 9 is a simplified bottom view of a universal BGA substrate according to another embodiment of the invention.

FIG. 9 is a simplified bottom view of a universal BGA substrate 900 according to another embodiment of the invention. FIG. 9 shows pairs of imaginary saw-line fiducials that identify the locations of the various keep-out zones (e.g., 204 and 304 of FIG. 3) for use in singulating arrays of BGA packages having different sizes. In particular, FIG. 9 shows horizontal saw-line fiducial pairs 902(1) and 902(2) and vertical saw-line fiducial pairs 904(1) and 904(2) used to singulate 6 mm BGA packages. FIG. 9 also shows horizontal saw-line fiducial pairs 906(1) and 906(2) and vertical saw-line fiducial pairs 908(1) and 908(2) used to singulate 7 mm BGA packages. These bottom saw-line fiducial pairs may be employed when the fiducial pairs on the top surface of the substrate are no longer detectable after the molding compound is applied over the top surface of the substrate. Note that FIG. 9 does not show the array of vias that are located within the substrate. Although FIG. 9 shows only two different types of saw-line fiducial pairs, in general, there will be as many different types of saw-line fiducial pairs on the bottom surface of a universal BGA substrate of the invention as the number of different types of fiducial pairs on the top surface.

Although not shown in the figures, at some point in the assembly process, solder balls are applied to some or all of the vias 102 exposed at the bottom surface of the substrate 100 or at the bottom surface of each BGA package 802, depending on whether the solder balls are applied before or after singulation. Those vias 102 that are located beneath a mounted IC die 502 will function as heat pipes that help dissipate heat away from the IC die 502.

Although BGA packages 802 have been described as each having a single IC die 502, in other embodiments of the invention, each BGA package may have two or more IC dies and/or one or more other components mounted onto the top surface of the substrate 100.

Although the invention has been described in the context of the substrate 100 having fiducial pairs corresponding to the upper left and lower right corners of different via sub-arrays, those skilled in the art will understand that substrates of the invention could have fiducial pairs corresponding to the lower left and upper right corners of different via sub-arrays, equivalent to rotating the substrate 100 by 90 degrees about is normal axis.

Although the invention has been described in the context of the substrate 100, which has four different types of fiducial pairs 106, 108, 110, and 112 having four specific sets of uniquely identifiable shapes and orientations corresponding to the four BGA package sizes of 6 mm, 7 mm, 8 mm, and 10 mm, those skilled in the art will understand that, in general, substrates of the invention may have two or more different types of fiducial pairs having any suitable, uniquely identifiable shapes and orientations corresponding to any suitable BGA package sizes.

In the substrate 100, each different fiducial pair comprises two fiducials that are rotated versions of the same shape. For example, fiducial 110(1) is a triangle, and fiducial 110(2) is the same triangle rotated 180 degrees about its normal axis. In general, as long as the different fiducials are uniquely identifiable, fiducial pairs may have two fiducials having different shapes.

Although the vias 102 are arranged in rows and columns in the BGA substrate 100, in general vias of the invention can be arranged in any suitable geometry.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A substrate for ball grid array (BGA) packages, the substrate comprising:
   a non-conducting matrix having a top surface and a bottom surface;
   an array of conducting vias extending between the top and bottom surfaces of the matrix;
   a plurality of first fiducial pairs on the top surface of the matrix, wherein each instance of the first fiducial pair indicates a location of a different via sub-array for a different BGA package of a first package size, wherein the plurality of first fiducial pairs define a first array of first package sites of the first package size; and a plurality of second fiducial pairs, different from the first fiducial pair, on the top surface of the matrix, wherein each instance of the second fiducial pair indicates a location of a different via sub-array for a different BGA package of a second package size different from the first package size, wherein the plurality of second fiducial pairs define a second array of second package sites, different from the array of first package sites, of the second package size, wherein the second package sites overlap the first package sites such that the substrate is usable for assembling BGA packages of only one of the first package size and the second package size at the same time, and wherein the first fiducial pair have a uniquely different design from a design of the second fiducial pairs.

2. The substrate of claim 1, wherein the matrix comprises multiple instances of the first fiducial pair that all have the same design.

3. The substrate of claim 1, wherein the matrix comprises multiple instances of the first fiducial pair distributed at different locations on the top surface of the matrix corresponding to multiple, non-overlapping via sub-arrays of a first size.

4. The substrate of claim 3, wherein the matrix comprises keep-out zones between adjacent via sub-arrays of the first size.

5. The substrate of claim 1, wherein the matrix comprises a plurality of additional fiducial pairs on the top surface of the matrix, wherein each instance of an additional fiducial pair indicates a location of a via sub-array for a BGA package of an additional package size different from the first and second package sizes.

6. The substrate of claim 1, wherein the matrix further comprises an array of solder balls on the bottom surface of the matrix, each solder ball connected to a different via.

7. The substrate of claim 1, wherein each fiducial is a metal structure on the top surface of the matrix.

8. The substrate of claim 1, further comprising:
multiple instances of a first bottom fiducial pair on the bottom surface of the matrix, wherein each instance of the first bottom fiducial pair indicates a location of a different saw line between the via sub-arrays for different BGA packages of the first package size; and multiple instances of a second bottom fiducial pair, different from the first bottom fiducial pair, on the bottom surface of the matrix, wherein each instance of the second bottom fiducial pair indicates a location of a different saw line between the via sub-arrays for different BGA packages of the second package size.

9. The substrate of claim 1, wherein:

the matrix comprises multiple instances of the first fiducial pair that all have the same design;

the multiple instances of the first fiducial pair are distributed at different locations on the top surface of the matrix corresponding to multiple, non-overlapping via sub-arrays of a first size;

the matrix comprises keep-out zones between adjacent via sub-arrays of the first size;

the matrix comprises one or more instances of each of one or more additional fiducial pairs on the top surface of the matrix, wherein each instance of an additional fiducial pair indicates a location of a via sub-array for a BGA package of an additional package size different from the first and second package sizes;

each fiducial is a metal structure on the top surface of the matrix; and further comprising:

multiple instances of a first bottom fiducial pair on the bottom surface of the matrix, wherein each instance of the first bottom fiducial pair indicates a location of a different saw line between the via sub-arrays for different BGA packages of the first package size; and multiple instances of a second bottom fiducial pair, different from the first bottom fiducial pair, on the bottom surface of the matrix, wherein each instance of the second bottom fiducial pair indicates a location of a different saw line between the via sub-arrays for different BGA packages of the second package size.

\* \* \* \* \*